United States Patent [19]
Hutchins

[11] Patent Number: 4,816,757
[45] Date of Patent: Mar. 28, 1989

[54] RECONFIGURABLE INTEGRATED CIRCUIT FOR ENHANCED TESTING IN A MANUFACTURING ENVIRONMENT

[75] Inventor: Charles L. Hutchins, Sugar Land, Tex.

[73] Assignee: Texas Instruments Incorporated, Dallas, Tex.

[21] Appl. No.: 171,194

[22] Filed: Feb. 29, 1988

Related U.S. Application Data

[63] Continuation of Ser. No. 709,266, Mar. 7, 1985.

[51] Int. Cl.$^4$ ............................................. G01R 31/28
[52] U.S. Cl. ............................... 324/158 R; 324/73 R
[58] Field of Search ............ 324/73 R, 73 PC, 158 R; 371/15, 16; 437/8

[56] References Cited

U.S. PATENT DOCUMENTS 3,242,428  3/1966  Brumley et al. ..................... 324/118
4,494,066  1/1985  Goel et al. ........................ 324/73 R

FOREIGN PATENT DOCUMENTS 78670  5/1983  European Pat. Off. ........ 324/73 PC Primary Examiner—Ernest F. Karlsen
Attorney, Agent, or Firm—Theodore D. Lindgren; Rodney M. Anderson

[57] ABSTRACT

A reconfigurable circuit operating in a test mode and a normal operating mode includes a memory array (10) which has a row decoder (12) for addressing the memory elements therein. The row decoder (12) has a fused switch (18) for referencing the output circuits thereon to either a standard reference voltage or an external reference voltage. The memory array (10) has a fused switch (22) associated therewith for referencing the charging voltage for the memory cells to either the positive reference voltage in the circuit or to an external variable voltage. The fused switches (18) and (22) are operable to switch to internal references for the normal operating mode and to the external variable voltages for the test mode.

4 Claims, 2 Drawing Sheets

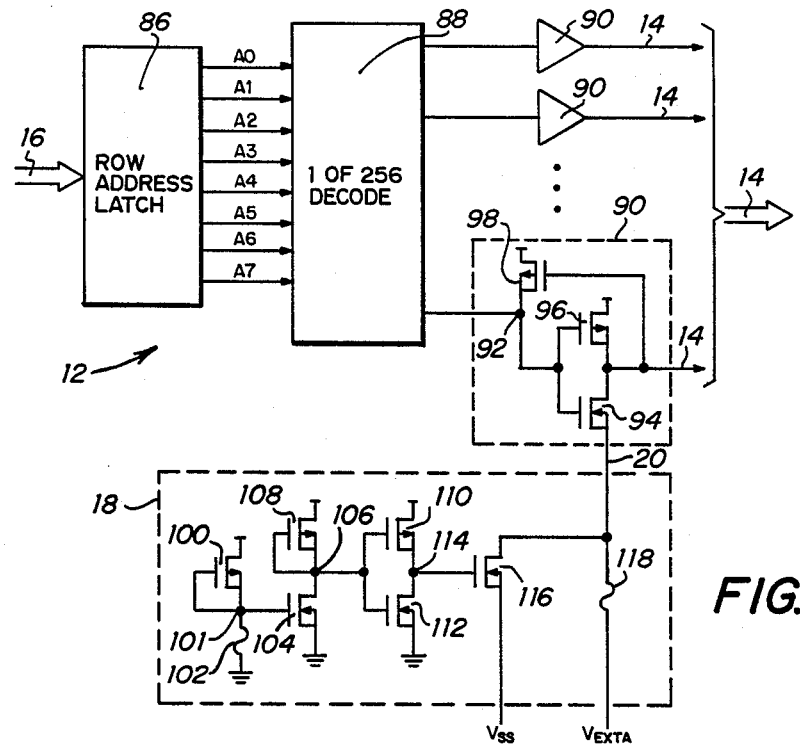
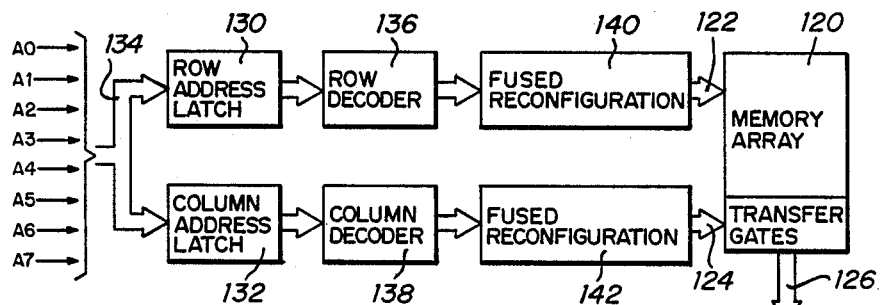
FIG. 5
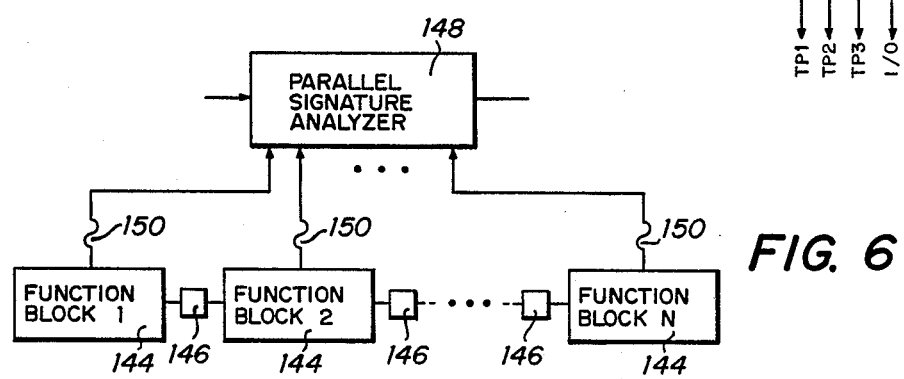
FIG. 6

RECONFIGURABLE INTEGRATED CIRCUIT FOR ENHANCED TESTING IN A MANUFACTURING ENVIRONMENT

This application is a continuation of application Ser. No. 709,266, filed Mar. 7, 1985.

TECHNICAL FIELD OF THE INVENTION

The present invention pertains in general to testing of integrated circuits and, more particularly, to a preconfigured testing circuit integral to the intergrated circuit that is operable to be disconnected after testing.

BACKGROUND OF THE INVENTION

As the demands of technology have increased, both the density and the multiplicity of functions performed by a given integrated circuit have increased. In addition, the speed at which data is processed through these integrated circuits has also increased. These devices are generally referred to as a large scale integrated circuits (VLSI). To reliably realize VLSI devices, new techniques have been developed to both fabricate the device at the semiconductor chip level and also to package the chip. There are some inherent disadvantages to this increased density and speed since the VLSI devices must still be interfaced with peripheral circuits and thus must have some output ports, control port, etc. Due to the large number of functions that are performed by a given VLSI chip, the number of interface connections or IC pins is relatively low as compared to the number of functions that the device performs. The result is that the internal functions are relatively inaccessible for trouble shooting and/or failure analysis, since use of interface connections must be optimized and they are generally dedicated to a functional mode of the device rather than testing modes.

Once a circuit is manufactured utilizing VSLI circuits, it is necessary to test the circuits prior to packaging thereof. This test normally consists of probing the device at the input and output pads and various test points thereon. Failures can then be determined and only acceptable devices packaged. However, in certain circuits, redundant circuit elements are provided that can be inserted in place of faulty elements. One type of circuit that this is utilized in is a semiconductor memory array wherein a redundant column is provided. When one column is determined to be defective, it is deactivated and the redundant column activated to provide a replacement therefor. This activation and deactivation is normally effected by opening polysilicon fuses that are fabricated on the integrated circuit. To open these fuses, a special test facility is provided which has a laser mounted adjacent the probing mechanism. This allows for both replacement of the defective device with the redundant circuit and also retesting thereof.

In testing integrated circuits prior to packaging thereof, speed is one important factor to be considered. Since yields can be as low as 10%, a large amount of time is utilized to test the 90% of defective devices, make a decision and reject these devices. It is therefore desirable to minimize the amount of time to perform a given test.

In addition to reducing the testing time, it is also desirable to measure the parameters of individual devices on a circuit. For a device such as a memory array where there are a large number of similar elements such as the memory cells, such factors as leakage, storage time, etc. are of paramount importance. However, the interconnections between the individual elements and interaction thereof inhibits access to the input and the output of these elements. For example, the storage capacitor in a Dynamic Random Access Memory (DRAM) is normally connected between a reference voltage and one side of a transistor. The parameters of this capacitor can only be measured by charging the capacitor through control of the transistor, with this control being the only variable. This control signal is derived from the output of either the column or row decoder and can only be tested within the constraints of the operation of the decoders. Heretofore, no provision has been made for testing the parameters of individual elements in an integrated circuit.

In view of the above disadvantages with testing the various parameters of integrated circuits, there exists a need for improved methods of performing the test by allowing access to the individual elements in the integrated circuit and also decreasing the time required for making these tests.

SUMMARY OF THE INVENTION

The present invention disclosed and claimed herein comprises a circuit having a manufacturing test mode and an operating mode. In the test mode, the parameters of the circuit are altered such that testing is facilitated whereas the operating mode allows normal operation. The circuit is divided into a group of functional blocks, each functional block having a separate set of operating parameters. A fused switch is provided for switching the functional circuit block between the normal operating mode and an altered operating mode wherein the operating parameters thereof are adjusted. The fused switch is manufactured in the initial mode and a fuse circuit is provided for allowing the fused switch to be switched to the operating mode after testing has been completed. The fuses are operable in the closed state to place the circuit in the test mode and in the open state to place the circuit in the operating mode. The fuses are opened with an external laser system.

BRIEF DESCRIPTION OF THE DRAWINGS

For a more complete understanding of the present invention and the advantages thereof, reference is now made to the following description taken in conjunction with the accompanying drawings in which:

FIG. 4 illustrates a schematic diagram of the reconfigurable row decoder of FIG. 1;

FIG. 5 illustrates an alternate embodiment of the present invention for reconfiguring the output arrangement of a semiconductor memory; and FIG. 6 illustrates an alternate embodiment of the present invention utilizing a parellel signature analyzer.

DETAILED DESCRIPTION OF THE INVENTION

Figure 1:
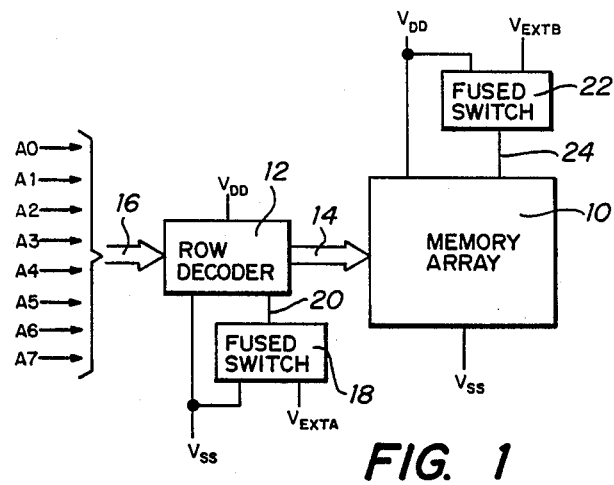
FIG. 1 illustrates a memory array utilizing the reconfiguration testing of the present invention.

Referring now to FIG. 1, there is illustrated a block diagram of a memory device which utilizes the reconfiguration test circuitry of the present invention. This memory is of the type commonly referred to as the MOS Random Access Memory (RAM) devices which are illustrated in U.S. Pat. No. 3,940,747, issued Feb. 24, 1976 to Kuo and Kitagawa, assigned to Texas Instruments Incorporated. The memory includes a memory array 10 which is comprised of a plurality of memory elements arranged in rows and columns. The device can consist, in one embodiment, of 65,536 memory cells which are generally divided into 256 rows and 256 columns. Each cell is a so called one transistor cell of the type illustrated in U.S. Pat. No. 4,081,701, issued Mar. 28, 1978 to White, et al. and assigned to Texas Instruments Incorporated.

A row decoder 12 selects one of 256 mutually exclusive row lines 14 on the memory array 10 in response to receiving an eight bit address A0–A7 on an address bus 16. In normal operation, the row decoder 12 operates at a voltage level of $V_{DD}$ referenced to a voltage of $V_{SS}$. The row lines 14 are alternated between $V_{DD}$ and $V_{SS}$, depending upon the logic state necessary to activate the selected one of the row lines. A fused switch 18 is provided that is connected to the row decoder 12 through a voltage control line 20 and is operable to determine the reference voltage that the row lines 14 are disposed at. The fused switch 18 supplies either $V_{SS}$ to the line 20 or an external voltage $V_{EXTA}$.

In operation, the row line is selected by row decoder 12 by changing the voltage in the row line to the reference voltage on the control line 20. In normal operation of the memory array 10, the reference voltage is disposed at $V_{SS}$ when the row line 14 is selected. When the row line 14 is deselected, the voltage is set to $V_{DD}$. In the test mode, the fused switch 18 is connected such that the external voltage $V_{EXTA}$ can be applied to the line 20 and to the selected one of the row lines 14. The voltage $V_{EXTA}$ is input to the memory of FIG. 1 through a test point on the surface of the integrated chip during the testing process. After the test has been performed at a different voltage than $V_{SS}$, a fuse or series of fuses in the fused switch 18 are opened and $V_{SS}$ is connected to the line 20 and the memory then operates in the normal operating mode. By utilizing the fused switch 18, a portion of the row decoder 12 can have the voltage for a given parameter altered, as will be described hereinbelow.

The memory array 10 also has a fused switch 22 connected thereto through a voltage control line 24. The fused switch 22 is operable to switch between $V_{DD}$ and an external voltage $V_{EXTB}$. In normal operation, the memory array 10 operates at the voltage of $V_{DD}$ reference to $V_{SS}$. In the test mode, the fused switch 22 is connected to apply $V_{EXTB}$ to the control line 24. After testing has been completed, the fused switch 22 is switched to $V_{DD}$. Both of the fused switches 18 and 22 are initially connected to the respective one of the external voltages $V_{EXTA}$ and $V_{EXTB}$ through external test probes. The switches 18 and 22 are manufactured in this mode. Therefore, it is necessary that the internal fuses of the fused switches 18 and 22 be opened in order to apply the correct voltages. These switches are only utilized during the testing procedure to test various parameters or enhance the testing of the parameters, as will be described hereinbelow.

Figure 2:
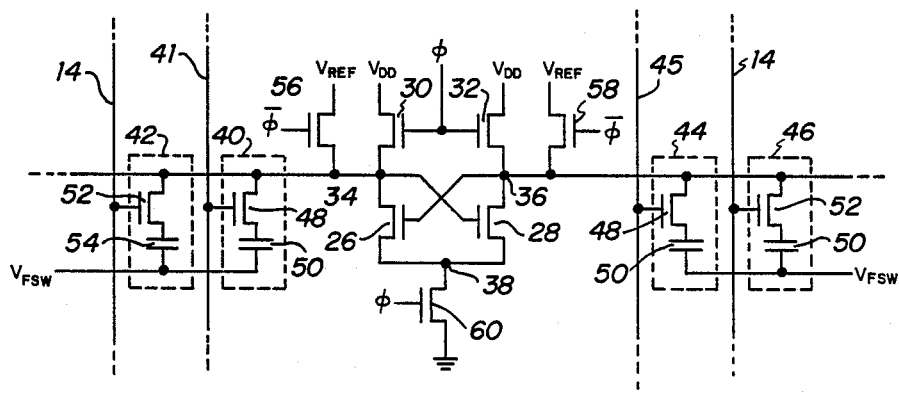
FIG. 2 illustrates a schematic diagram of a sense amp and associated memory cells for the circuit of FIG. 1.

Referring now to FIG. 2, there is illustrated a schematic diagram of a sense amplifier in one of the rows in the memory array 10 with associated memory cells. The sense amplifier consists of a flip-flop or bistable circuit having two cross coupled driver transistors 26 and 28 with associated load transistors 30 and 32. Nodes 34 and 36 represent column lines in the memory array 10 with the node 34 being connected to the drain of the transistor 26 and the gate of the transistor 28 and the node 36 being connected to the drain of the transistor 28 and the gate of the transistor 26 to form a cross coupled arrangement. The sources of transistors 26 and 28 are connected to a common node 38. The load transistors 30 and 32 have the sources thereof connected to the nodes 34 and 36, respectively, and the gates thereof connected to a signal $\phi$. The sources thereof are connected to $V_{DD}$.

The node 34 has a dummy cell 40 connected thereto and controlled by a dummy cell control line 41 and a memory cell 42 controlled by one of the control lines, the memory cell 42 representative of all of the memory cells attached to a select column line in the memory array 10. In a similar manner, node 36 has a dummy cell 44 connected thereto and controlled by a dummy cell control line 45 and a memory cell 46 connected thereto.

Dummy cells 40 and 44 are each comprised of a transistor 48 and a capacitor 50. The gates of transistor 48 are activated by the dummy cell control lines 41 or 45, respectively. Each of the memory cells 42 and 46 is comprised of a transistor 52 and a capacitor 54. Each of the capacitors 50 and 54 have one plate thereof connected to the voltage signal $V_{FSW}$ and the other plate thereof connected to the drain of the respective one of the transistors 48 or 52, respectively. The gates of the transistor 52 are activated by the row control lines 14. Each of these cells is further described in U.S. Pat. No. 3,909,631, issued to Kitagawa on Sept. 30, 1975 and assigned to Texas Instruments Incorporated. In operation, one of the memory cells connected to either the node 34 or 36 is selected, and the dummy cell connected to the opposite node is activated by the appropriate one of the dummy cell control lines 41 or 45.

The node 34 is connected to a reference voltage $V_{REF}$ through a transistor 56 and the node 36 is also connected to $V_{REF}$ through a transistor 58. The transistors 56 and 58 have the gates thereof connected to the clock signals $\bar{\phi}$. The transistors 56 and 58 function to charge the nodes 34 and 36 equally to the voltage level selected to be approximately $(V_{DD}-2V_T)$.

The source of each of the transistors 26 and 28 in each of the sense amplifiers, as described above, is connected to the common node 38. This node 38 is connected to ground through a transistor 60 which has the gate thereof driven by the timing signal $\phi$. The transistor 60 is operable to determine the amount of current drawn from the node 38 to ground. The sensitivity of the sense amplifier is a function of the current drawn through the transistors 26 and 28, as described in detail in U.S. Pat. No. 4,050,061.

As soon as operation is initiated, the flip-flop will tend to go toward a stable condition where either the transistor 26 is conductive and transistor 28 is cut off, or vice versa. The direction of switching depends upon the voltage difference between the nodes 34 and 36, which in turn depends upon whether a logic "1" or a logic "0" was stored in the selected memory cells 42 or 46. Since one of the nodes 34 or 36 will be at a slightly higher voltage than the other, one of the transistors 26 or 28 will have a slightly higher voltage on its gate than the other. Thus, when $\phi$ goes positive, one transistor will tend to conduct slightly more current than the other.

Figure 3:
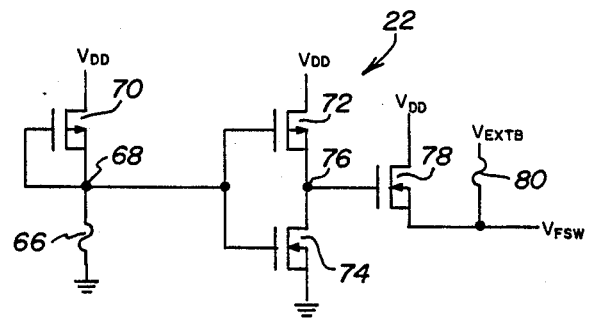
FIG. 3 illustrates a schematic diagram of the fused switch circuit for controlling the memory in FIG. 1.

Referring now to FIG. 3, there is illustrated a schematic diagram of the fused switch 22 which generates the signal $V_{FSW}$ for determining the reference voltage from which the capacitors 50 and 54 are charged. A fuse 66 is connected between a node 68 and ground. A p-channel transistor 70 is connected between $V_{DD}$ and the node 68 with the source thereof shorted to the gate. The node 68 is connected to the gates of a p-channel transistor 72 and an n-channel transistor 74. The n-channel transistor 74 is connected between a node 76 and ground. The p-channel transistor 72 is connected between $V_{DD}$ and the node 76. A p-channel transistor 78 is connected between $V_{DD}$ and $V_{FSW}$ with the gate thereof connected to the node 76. A fuse 80 is connected between $V_{FSW}$ and the external test point $V_{EXTB}$.

In operation with the fuse 66 intact, the transistor 70 is off and the node 68 is at ground. This turns transistor 72 on and transistor 74 off, pulling node 76 to $V_{DD}$. This in turn turns transistor 78 off, disconnecting $V_{FSW}$ from $V_{DD}$ With fuse 80 intact, the signal $V_{EXTB}$ can be applied to the reference side of the capacitors 50 and 54.

When the fuse 66 and the fuse 80 are opened, transistor 70 pulls node 68 to $V_{DD}$, thus turning transistor 74 on and turning transistor 72 off. This pulls node 76 to ground, turning transistor 78 on and applying $V_{DD}$ to the reference side of the capacitors 50 and 54.

In operation, the voltage signal $V_{FSW}$ is operable to change the maximum value across the capacitors 50 and 54 during testing thereof. One of the important parameters of a Dynamic Random Access Memory (DRAM) is the amount of time that the capacitors in the memory elements can hold a charge. This is relative to the reference voltage $V_{REF}$. This reference voltage provides a trip point for comparison with the charge on the memory cell. Therefore, the memory cell is only required to have a charge slightly higher or lower than the reference voltage. If the voltage is low, the amount of time required for it to discharge is relatively low. If the voltage across the capacitor could be increased, this discharge time is also increased. This is due to the relationship of stored energy to voltage wherein energy is proportional to a square of a voltage. However, it is only desirable to raise the plate voltage of the capacitors 50 and 54 and not the operating voltage of the remainder of the system since this sets a number of parameters such as clock delays, terminal and times of transistors, etc. Therefore, with the fused circuit of FIG. 3, an external voltage can be input to one plate of all of the capacitors and then the capacitors tested. The external voltage $V_{EXTB}$ is input through a test probe on a separate pad. Therefore, it is not necessary to provide an extra external connection to the chip to input the external voltage. After testing, the fuses 66 and 80 can be opened, thus applying $V_{DD}$ to the reference side of the capacitors 50 and 54.

Referring now to FIG. 4, there is illustrated a schematic block diagram of the row decoder 12 and the fused switch 18, wherein like numerals refer to like parts in the various Figures. The address is latched in a row address latch 86 to output the latched address A0-A7 into a one of 256 decoder circuit 88. The decoder circuit 88 outputs 256 mutually exclusive outputs, each of which is input to a separate row line in the memory array 10 through a buffer 90. The buffer 90 has the input thereof connected to a node 92 with the node 92 being connected to the gate of an n-channel transistor 94 and a p-channel transistor 96. In addition, the node 92 is connected to the drain of a p-channel transistor 98. The source of the transistor 94 is connected to the control voltage line 20 and the drain thereof is connected to the row line 14. The transistor 96 has the source thereof connected to the row line 14 and the drain thereof connected to $V_{DD}$. The transistor 98 has the gate thereof connected to the row line 14 and the drain thereof connected to $V_{DD}$. Each of the buffers 90 are interconnected with the voltage control line 20 to provide a reference voltage for the respective one of the transistors 94.

The fused switch 18 is comprised of a p-channel transistor 100 having the drain thereof connected to $V_{DD}$ and the gate and source thereof connected to a node 101. The node 101 is connected to ground through a fuse 102 and also to the gate of an n-channel transistor 104, the source of which is connected to ground and drain of which is connected to a node 106. A p-channel transistor 108 has the drain thereof connected to $V_{DD}$ and the gate and source thereof connected to node 106. The node 106 is connected to the gates of a p-channel transistor 110 and an n-channel transistor 112. The p-channel transistor 110 has the source thereof connected to a node 114 and the drain thereof connected to $V_{DD}$. The n-channel transistor 112 has the source thereof connected to ground and the drain thereof connected to the node 114, the node 114 being connected to the gate of an n-channel pass transistor 116. The pass transistor 116 has the source thereof connected to $V_{SS}$ and the drain thereof connected to the control line 20. As described above, ground and $V_{SS}$ are normally the same but, for illustrative purposes, $V_{SS}$ is distinguished as a reference voltage. The external voltage $V_{EXTA}$ is connected to the control line 20 through a fuse 118.

When the fuses 102 and 118 are intact, the voltage $V_{EXTA}$ is applied to the control line 20 to determine the reference voltage that is placed onto the row line 14 when the transistor 94 for one of the respective buffers 90 is turned on. This represents the select state for one of the rows. In the unselected state, the transistor 94 is turned off and the transistor 96 turned on to hold the row line 14 at $V_{DD}$. With the fuse 102 intact, node 101 is held to ground, thus turning off transistor 104 and turning on transistor 108. This keeps node 106 at $V_{DD}$, turning on transistor 112 and turning off transistor 110. This places the pass transistor 116 in the nonconducting state and allows current to be sinked at the voltage $V_{EXTA}$ through the fuse 118.

When fuses 102 and 118 are open, transistor 100 holds node 101 to $V_{DD}$ and turns on transistor 104 to pull node 106 to ground, thus turning off transistor 112 and turning on transistor 110. This causes pass transistor 116 to conduct, thus connecting the reference voltage $V_{SS}$ to the control line 20 and allows the circuit to function with normal operating parameters.

During a test operation, the row line 14 provides a bias for the gate of the memory cell transistors 52. In normal operation, the transistors 52 are designed to turn on or off, thus preventing actual measurement of leakage of the transistors. By decreasing the voltage thereon, the transistor 10 can be set to a predetermined voltage to determine actual leakage in the device. With the fused switch 18, testing is facilitated on only the memory cell transistors 52 without affecting the voltage references for the remainder of the circuit. In this manner, parametric tests for select functional blocks or components can be carried out independent of the operation of the remaining portion of the circuit.

Referring now to FIG. 5, there is illustrated a schematic block diagram of a fuse circuit for reconfiguring the memory array in a semiconductor memory. A memory array 120 is provided which is similar to the memory array 10 of FIG. 1. The memory array 120 has the memory cells therein arranged in rows and columns with the memory cells selected by signals placed onto row lines 122 and the column selected by the signal placed onto column lines 124. The row lines 122 activate the gates of all of the memory cell transistors associated with that particular row line. The output of each of these memory cells is then stored in the associated one of the sense amps (not shown) for connection to the particular column line. To select the information stored in the sense amp, it is necessary to activate one or more transfer gates 126, of which one is associated with each column. The transfer gates 126 are each controlled by one of the column lines 124. For example, if the memory array were a "by one", only one of the column lines 124 would be activated at a time to output information from only one of the memory cells in the selected row. If the memory were are "by four", the outputs of four cells in the selected row would be output. In the device illustrated in FIG. 5, only one memory cell can be selected in the normal configuration. This selected memory element is then input to an input/output circuit (I/O) 128 for output on an I/O line. However, it would be desirable during the testing mode to test more than one cell at a time. Therefore, reconfiguration circuitry is disposed on the circuitry in accordance with the present invention to test four cells at a given time. This essentially reconfigures a "by one" memory into a "by four".

An eight bit address A0-A7 is input to a row address latch 130 and a column address latch 132 through an address line 134. The output of the row address latch 130 is input to a row decoder 136 and the output of the column address 132 is input to a column decoder 138. The row decoder 136 and the column decoder 138 both output only one output for each column and row address input thereto. This normally selects only one row and one column. However, the row decoder can be reconfigured by a fuse reconfiguration circuit 140 and the column decoder 138 can have the output thereof reconfigured by a fused reconfiguration circuit 142. Therefore, more than one row can be selected for a given address on the row lines 122 and more than one column can be selected for a given address on columns lines 124. The additional outputs are input to the I/O circuit 128 and then output on lines TP1, TP2 and TP3. These are test points on the chip which can be probed during manufacturing tests and they do not require interconnection during normal operation mode. Each of the fused reconfiguration circuits 140 and 142 are configured to control the row lines or column lines to output information from additional ones of the memory cells in the memory array 120 during the initial test. Internal fuses can then be opened and the circuit placed in a normal operating mode.

Referring now to FIG. 6, there is illustrated an alternate embodiment of the present invention wherein the integrated circuit is divided into a plurality of function blocks 144. The function blocks 144 are labeled "1" through "N" and represent the various functions in an integrated circuit such as the memory array. Each of the function blocks is connected to the other function block through a normally open fuse connection 146 such that the function blocks 144 can interact in a cohesive manner. One example, as described above, is a memory array wherein the functions are such things as clock generating circuits, decoder circuits and the various functions utilized in storing information in the memory elements. The output of each of the function blocks is connected to a parallel signature analyzer (PSA) 148 through fuses 150. The PSA 148 receives data from each of the function blocks and analyzes this data in a parallel manner. These techniques are fully discussed in "Analysis and Assimilation of Parallel Signature Analysis", International Test Conference, 1982 Proceedings, T. Sirdhar, D. S. Ho, P. T. Powell, S. M. Thatte, pp. 656-661.

When the test is performed, the result is compared with an expected result to determine if all of the function blocks 144 operate in the expected manner. If not, this device is registered as a defect and further testing performed to determine the nature of the failure. If, however, the result provides the true comparison with the expected result, the fuses 150 are opened and the fuse circuit 146 is activated to interconnect the various function blocks 144 and the circuit operated in its normal mode.

In summary, there has been provided a device for increasing the testability of integrated circuits. Select parameters on an integrated circuit are accessed through configuration circuits which are configured in a first mode to enhance testability by allowing access to select parameters and in a second mode for normal operation. During the first mode, the circuit is tested and then fuses opened or contacts made to place the circuit in the second mode. By allowing access to the select parameters, testing can be more easily facilitated.

Although the preferred embodiment has been described in detail, it should be understood that various changes, substitutions and alterations can be made therein without departing from the spirit and scope of the invention as defined by the appended claims.

What is claimed is:

1. An improvement in an integrated circuit having at least first and second coupled functional blocks having separate sets of operational parameters, wherein an operational parameter of said first functional block is sensitive to the voltage of a bias node coupled to a bias terminal of said circuit so that the voltage at said bias node is dependent upon the voltages applied to said bias terminal, the improvement comprising:
   a test voltage terminal connected to operate said first functional block and connected to said bias node to permit operation of said first functional block in conjunction with said second functional block with a bias voltage applied to operation of said first functional block;
   means for disconnecting said test voltage terminal from said bias node;
   means, connected between said bias terminal and said bias node, for isolating said bias node from said bias terminal; and
   means, connected to said isolating means, for disabling said isolating means from isolating said bias node from said bias terminal.

2. The improved circuit of claim 1, wherein said disconnecting means comprises a first fuse connected between said test voltage terminal and said bias node, said circuit being manufactured with said first fuse in its conductive state.

3. The improved circuit of claim 2, wherein said disabling means comprises a second fuse connected between said isolating means and a second bias node, said circuit being manufactured with said second fuse in its conductive state;
   wherein said isolating means is responsive to the voltage at said second bias node so that, responsive to said second fuse being in its conductive state, said bias node is isolated from said bias terminal.

4. The improved circuit of claim 3, wherein said first and second fuses are adapted to be opened by a beam from a laser.

* * * * *